US006925428B1

(12) United States Patent
Kaminski

(10) Patent No.: US 6,925,428 B1
(45) Date of Patent: Aug. 2, 2005

(54) MULTIFUNCTIONAL, MULTI-INPUT, MISSILE SIGNAL MEASUREMENT APPARATUS

(75) Inventor: Gregory R. Kaminski, Waldorf, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 09/573,220

(22) Filed: May 19, 2000

(51) Int. Cl.[7] ............................. G06F 11/00; H03M 1/12
(52) U.S. Cl. .................... 703/13; 702/121; 341/122; 341/155; 327/2
(58) Field of Search ................... 703/13, 14; 341/155, 341/120, 141, 144, 145, 156; 324/76.12, 76.42, 76.24, 76.15; 702/66, 79, 121

(56) References Cited

U.S. PATENT DOCUMENTS

| | | | |
|---|---|---|---|
| 4,686,674 A | | 8/1987 | Lam |
| 4,701,745 A | | 10/1987 | Waterworth |
| 4,740,966 A | | 4/1988 | Goad |
| 4,807,161 A | * | 2/1989 | Comfort et al. ............ 364/550 |
| 4,933,676 A | | 6/1990 | Haugue et al. |
| 4,974,058 A | | 11/1990 | Takayama |
| 5,150,310 A | * | 9/1992 | Greenspun et al. ......... 364/516 |
| 5,345,409 A | * | 9/1994 | McGrath et al. ............ 364/736 |
| 5,646,521 A | * | 7/1997 | Rosenthal et al. ......... 324/158.1 |
| 6,049,233 A | | 4/2000 | Shurboff |
| 6,137,283 A | * | 10/2000 | Williams et al. ......... 324/76.12 |
| 6,163,294 A | * | 12/2000 | Talbot ................... 342/357.06 |
| 6,362,768 B1 | * | 3/2002 | Younis et al. ............... 341/155 |

* cited by examiner

Primary Examiner—Thai Phan
(74) Attorney, Agent, or Firm—Frederic Zimmerman

(57) ABSTRACT

A printed wiring board includes an input conditioner having a plurality of analog dc inputs and a plurality of analog dc outputs; a switching circuit having an analog dc output, the switching circuit being connected to the plurality of analog dc outputs of the input conditioner; a sample and hold converter having an analog dc output, the sample and hold converter being connected to the analog dc output of the switching circuit; an A/D converter having a digital output, the A/D converter being connected to the analog dc output of the sample and hold converter; a microprocessor connected to the digital output of the A/D converter; a timer circuit connected to the microprocessor; a random access memory connected to the microprocessor; and a VME interface connected to the microprocessor. The printed wiring board further comprises an ac multiplexer; a plurality of rms to dc converters connected to the ac multiplexer, the rms to dc converters being connected to the switching circuit; a zero crossing detector connected to the ac multiplexer; a phase detector connected to the zero crossing detector and to the microprocessor; a filter connected to one of the outputs of the zero crossing detector; and a frequency measurement circuit connected to the filter and to the microprocessor.

8 Claims, 4 Drawing Sheets

SINE WAVE         TTL         3 BIT WORD

MULTIFUNCTIONAL, MULTI-INPUT, MISSILE SIGNAL MEASUREMENT APPARATUS

STATEMENT OF GOVERNMENT INTEREST

The invention described herein may be manufactured and used by or for the Government of the United States of America for government purposes without the payment of any royalties therefor.

BACKGROUND OF THE INVENTION

The invention relates in general to a signal measurement apparatus and in particular to a signal measurement apparatus for a missile.

Prior methods used to perform the objectives of the present invention are inefficient and costly. Because the invention is multifunctional, many of the objectives were performed in the past by many different modules and circuit boards. To sample a large quantity of analog signals, multiple analog to digital (A/D) converter boards were used, or a single board with very slow multiplexing switching times was, used. Different modules were needed to handle signal conditioning, dc signals, ac signals, frequency, and three phase power lines.

Using the old methods, the system processor board would process the signals received and significantly slow down the whole system. In the present invention, all the processing is performed locally on board thereby relieving the system processor of these duties. This provides for a much faster and efficient system. In the past, missile input data was only stored when received or removed. With the onboard random access memory (RAM) and storage algorithm of the present invention all the data throughout the launch can be stored.

SUMMARY OF THE INVENTION

In accordance with the present invention, a printed wiring board includes an input conditioner having a plurality of analog dc inputs and a plurality of analog dc outputs; a switching circuit having an analog dc output, the switching circuit being connected to the plurality of analog dc outputs of the input conditioner; a sample and hold converter having an analog dc output, the sample and hold converter being connected to the analog dc output of the switching circuit; an A/D converter having a digital output, the A/D converter being connected to the analog dc output of the sample and hold converter; a microprocessor connected to the digital output of the A/D converter; a timer circuit connected to the microprocessor; a random access memory connected to the microprocessor; and a VME interface connected to the microprocessor.

The printed wiring board further comprises an ac multiplexer having a plurality of analog ac inputs and a plurality of analog ac outputs; a plurality of rms to dc converters having a plurality of analog dc outputs, the rms to dc converters being connected to a plurality of analog ac outputs of the ac multiplexer, the analog dc outputs of the rms to dc converters being; connected to the switching circuit; a zero crossing detector having three outputs, the zero crossing detector being connected to three analog ac outputs of the ac multiplexer; a phase detector connected to the three outputs of the zero crossing detector and to the microprocessor; a filter connected to one of the outputs of the zero crossing detector; and a frequency measurement circuit connected to the filter and to the microprocessor.

Another aspect of the invention is a method of processing analog ac and analog dc signals comprising reducing voltages of the analog dc signals from a maximum of about plus or minus 52 volts to a maximum of about plus or minus 15 volts; converting the analog ac signals to analog dc signals; converting analog dc signals to digital dc signals; and for each channel, time tagging and storing only the digital dc signals that change in value.

Further objects, features and advantages of the invention will become apparent from the following detailed description taken in conjunction with the following drawing.

BRIEF DESCRIPTION OF THE DRAWING

Throughout the Figures, reference numerals that are the same refer to the same features.

DETAILED DESCRIPTION OF THE PREFERRED EMBODIMENTS

The present invention is capable of measuring and storing both alternating current (ac) and direct current (dc) signals, ac frequency, time tagging signals and detecting proper 3 phase ac orientation. The invention can be used in many other applications than its use in missile simulators. The invention can be used in any system requiring ac voltage, dc voltage, and frequency measurements as well as 3 phase detection and data storage. Because the printed wiring board (PWB) has an on board microprocessor and Eproms, software can be modified to make the invention extremely versatile and adaptable to the target system. The PWB has a VME bus interface, which is one of the most standard busses used in industry today. With the VME interface, the invention can be integrated into any VME system.

The purpose of the invention is to provide a single PWB that encompasses a multitude of functions as outlined below:

a. High number of analog inputs (41 dc, 12 ac);
b. VME bus interface which generates and receives interrupts;
c. Wide input voltage range (±52.5 volts dc and 7 volts rms);
d. Capability to measure frequency;
e. Detection of proper phase orientation of three phase signals;
f. Processing and recording analog inputs on board without using other processor resources elsewhere in the system; and
g. Time tag the signals when received and/or removed or whenever commanded via software.

Figure 1:
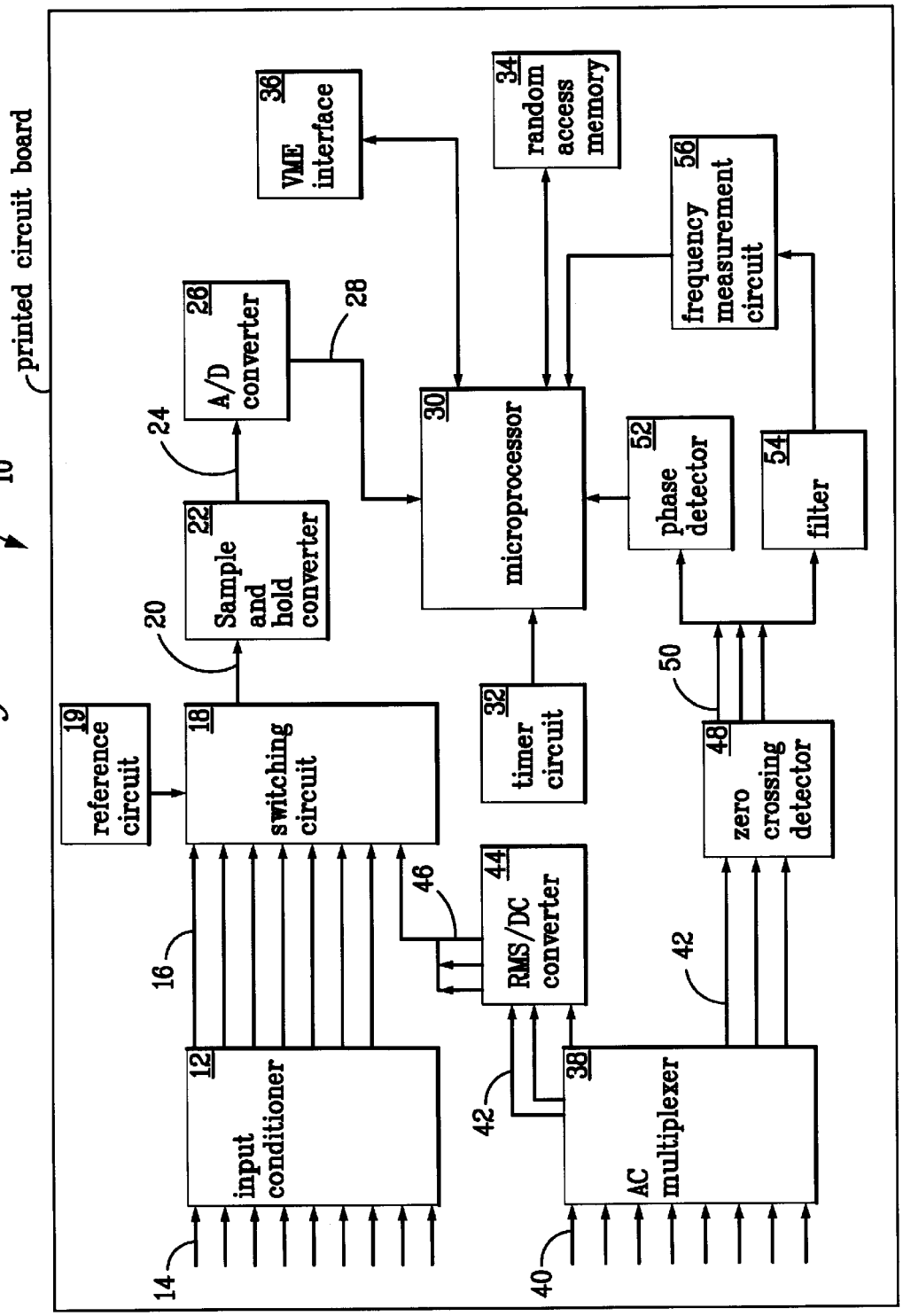
FIG. 1 is a schematic drawing of one embodiment of the invention.

FIG. 1 is a schematic drawing of one embodiment of the invention. A PWB 10 includes an input conditioner 12 having a plurality of analog dc inputs 14 and a plurality of analog dc outputs 16. A switching circuit 18 has an analog dc output 20 and is connected to the plurality of analog dc outputs 16 of the input conditioner 12. A five volt reference circuit 19 inputs a five volt reference to the switching circuit 18. A sample and hold converter 22 has an analog dc output 24 and is connected to the analog dc output 20 of the switching circuit 18. An analog to digital (A/D) converter 26 has a digital output 28 and is connected to the analog dc output 24 of the sample and hold converter 22. A microprocessor 30 is connected to the digital output 28 of the A/D converter 26, a timer circuit 32, a random access memory (RAM) 34 and a VME interface 36.

The PWB 10 further includes an ac multiplexer 38 having a plurality of analog ac inputs 40 and a plurality of analog ac outputs 42. Block 44 represents a plurality of rms (root mean square) to dc converters. Preferably, the number of rms to dc converters is four. The rms to dc converters 44 have a plurality of analog dc outputs 46 and are connected to a plurality of analog ac outputs 42 of the ac multiplexer 38. The analog dc outputs 46 of the rms to dc converters 44 are connected to the switching circuit 18; A zero crossing detector 48 has three outputs 50 and is connected to three analog ac outputs 42 of the ac multiplexer 38. A phase detector 52 is connected to the three outputs 50 of the zero crossing detector 48 and to the microprocessor 30. A filter 54 is connected to one of the outputs 50 of the zero crossing detector 48. A frequency measurement circuit 56 is connected to the filter 54 and to the microprocessor 30.

The number of analog dc inputs is preferably 41 and the number of analog ac inputs is preferably 12. The input conditioner 12 accepts dc voltages in the range of ±52.5 volts dc and converts them into dc voltages in the range of ±15 volts dc. The input conditioner 12 reduces the voltages using voltage divider circuits. The ac outputs 42 feed into both the zero crossing detector 48 and the rms to dc converters 44. The rms to dc converters 44 convert the ac signals into their equivalent dc rms values. The dc signals 16, 46 pass through a unique switching circuit 18 that quickly and efficiently switches the inputs to the sample and hold converter 22.

The sample and hold converter 22 retains the voltage level of the signal on its output while the A/D converter 26 converts it into a digital value. Simultaneously, the multiplexers 58 (See FIG. 2) in the switching circuit 18 set up the next input signal on the input of the sample and hold converter 22. The microprocessor 30 processes the data read from the A/D converter 26 and takes appropriate action. The microprocessor 30 reads the time from the timer circuit 32 and time tags the data.

The zero crossing detector 48 converts the ac signals 42 into a dc TTL square wave. The filter 54 filters any noise created by the zero crossing detector 48 and provides a clean signal for the frequency measurement circuit 56. The frequency measurement circuit 56 converts the frequency into digital data that is read and processed by the microprocessor 30. The microprocessor 30 uses the RAM 34 to store the data captured by the A/D converter 26. Preferably, the RAM 34 comprises 3 Mb of static RAM. The VME interface 36 is used by the microprocessor 30 to communicate with other VME circuit boards on the VME bus.

The input conditioner 12 accepts a very wide input voltage range. Typically A/D boards accept either ±5V or ±10V. The present invention accepts a much more flexible and wider input range of ±52V. The invention also has a large number of input channels (41 dc and 12 ac). Multiplexers 58 (FIG. 2) are used to switch the input channels to the A/D converter 26. An inherent problem of very slow switching times exists when trying to multiplex a large number of channels with wide voltage swings such as the ±52V of the PWB 10. To resolve this problem and reduce the switching time of the input channels, the invention uses the unique switching circuit 18 shown in FIG. 2.

Figure 2:
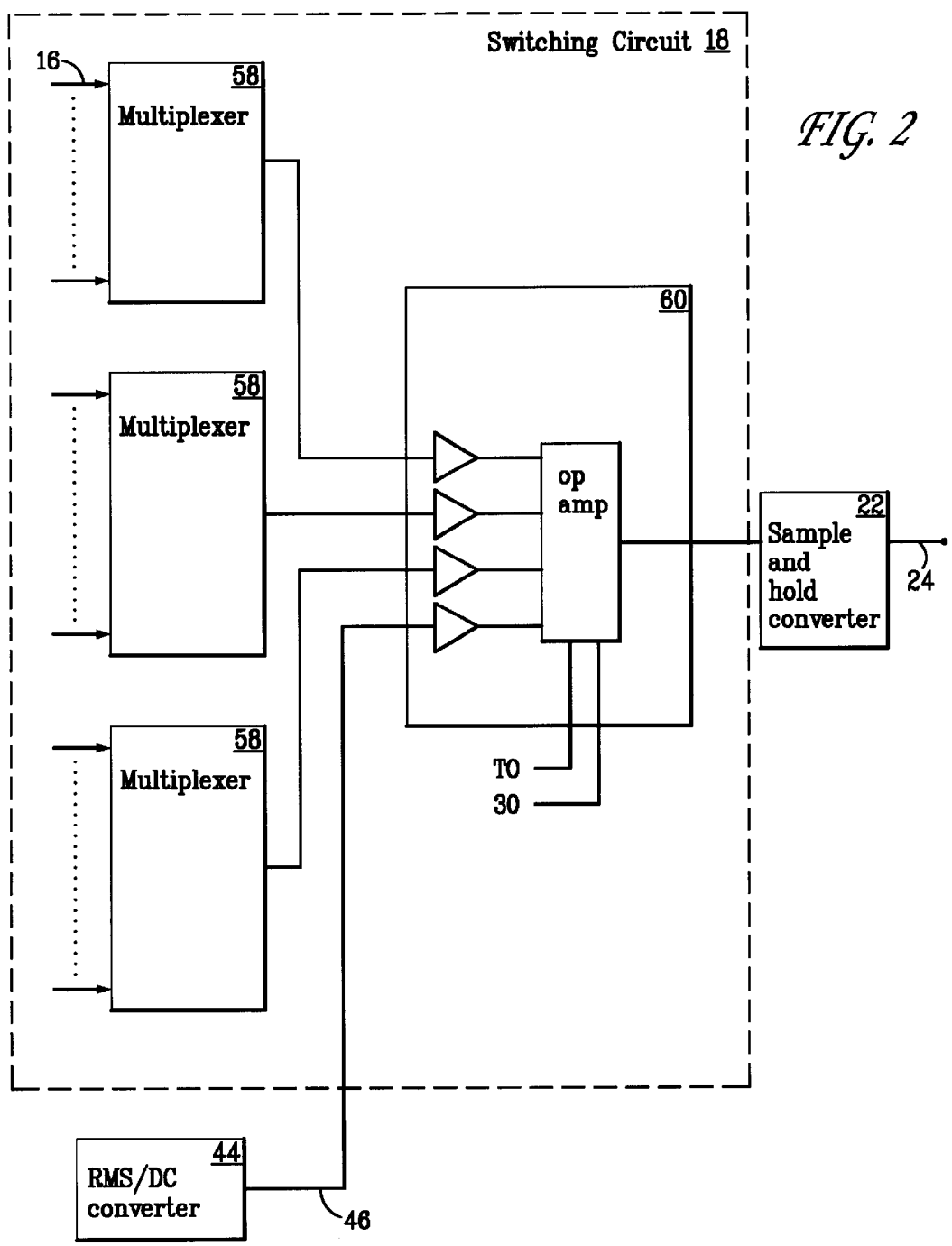
FIG. 2 is a schematic drawing of the switching circuit of the invention.

FIG. 2 is a schematic drawing of the switching circuit 18 of the invention. The initial stage of multiplexers are three traditional sixteen input multiplexers 58. Normally the outputs of the multiplexers 58 are tied together and passed through to the A/ID converter. Tying the outputs of the multiplexers 58 together causes the switching time of the circuit to increase greatly. The present invention uses a second stage four channel programmable op amp 60 to enhance the switching time. Each output of the initial stage multiplexers 58 feeds into the input of the programmable op amp 60. The op amp 60 can switch at speeds in the neighborhood of 900 ns as compared to 40 us using the old method with the outputs of all the multiplexers tied together. By switching the channels of the initial stage multiplexers 58 that are not being used on the second stage programmable op amp 60, the channels of the multiplexers 58 are able to settle before the A/D converter 26 needs to read them. This technique greatly increases the rate at which a large number of analog input channels can be sampled.

Figure 3A:
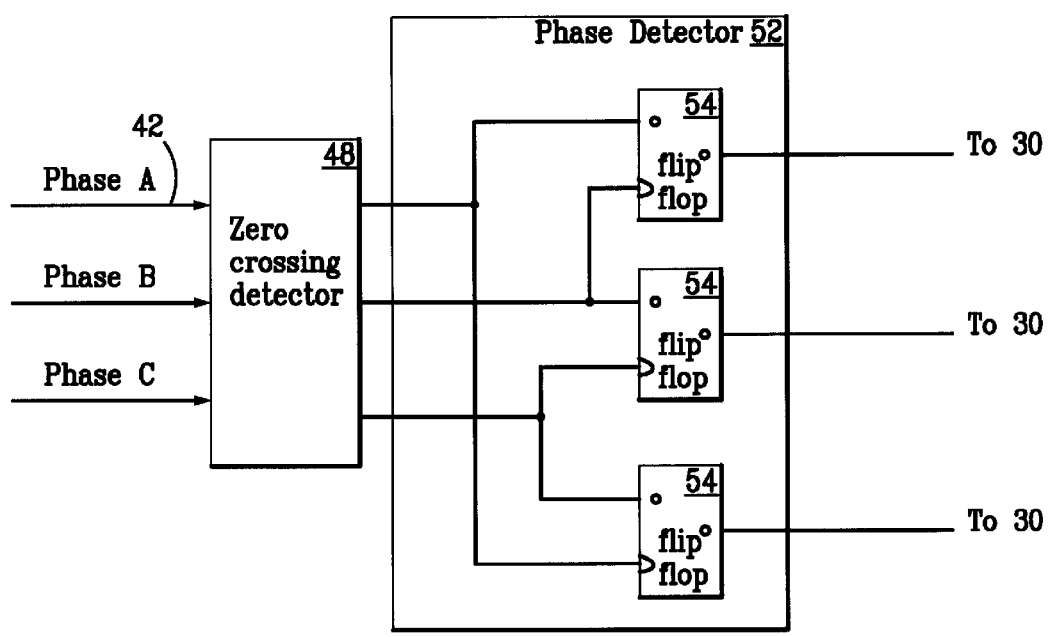
FIG. 3(A) is a schematic drawing of the phase detector of the invention and FIG. 3(B) shows the associated signals.
Figure 3B:
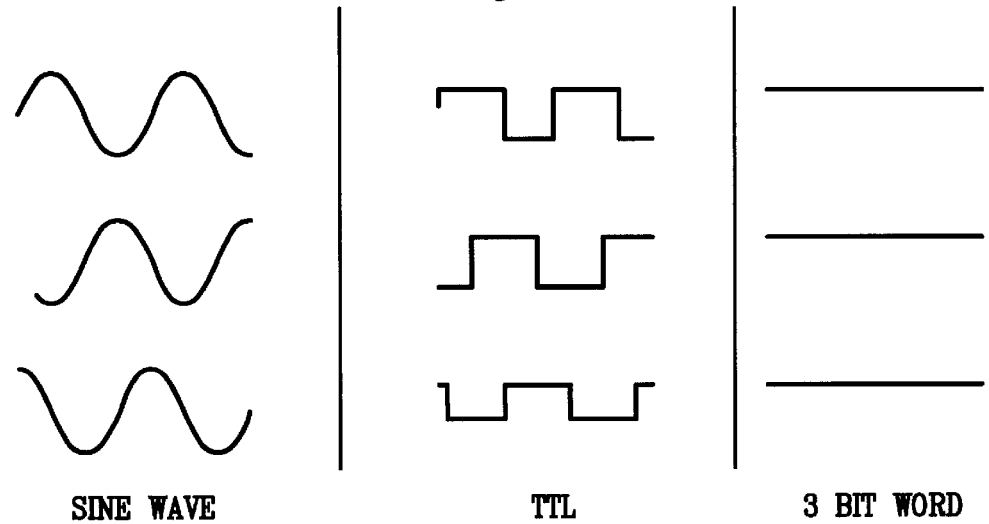

The invention also provides a circuit which detects proper phase orientation for three phase power lines. FIG. 3(A) is a schematic drawing of the phase detector 52 of the invention and FIG. 3(B) shows the associated signals. The zero crossing detector 48 converts the ac sine waves into TTL (transistor-transistor logic) level signals. The TTL signals then feed into the phase detector 52. The phase detector 52 is an Erasable Programmable Logic Device (EPLD) which decodes the three phases into a three bit TTL word using flip flops 54. If the three phase orientation is correct (i.e., each phase 120 degrees apart), the output of all the flip flops 54 will be a logic level "1". If the phases are out of orientation, one or more of the outputs of the flip flops 54 will be at a logic level "0". The microprocessor 30 reads the bits and determines proper three phase orientation.

The capability of the invention to time tag signals, store the data in local RAM, and process the data locally on board enables the use of a method that greatly increases the amount of data that can be stored locally. The basis of the method is to store only those readings for each channel which change in value. Because the microprocessor time tags each reading from the A/D converter 26, the original waveforms can be recreated from the data and their time tags.

Figure 4A:
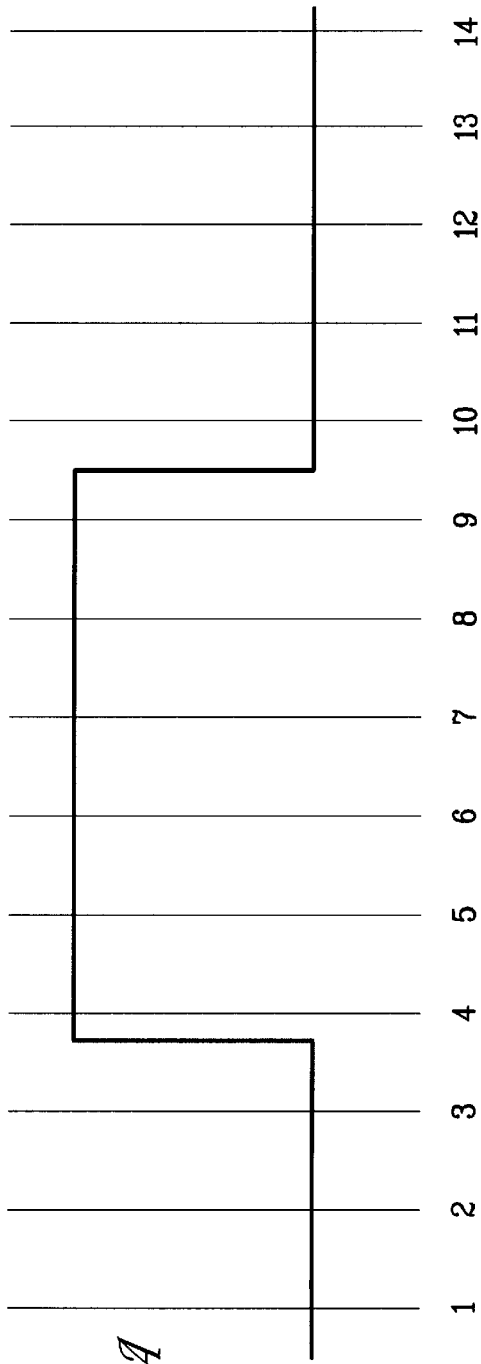
FIGS. 4(A) and (B) are diagrams of an analog waveform.
Figure 4B:
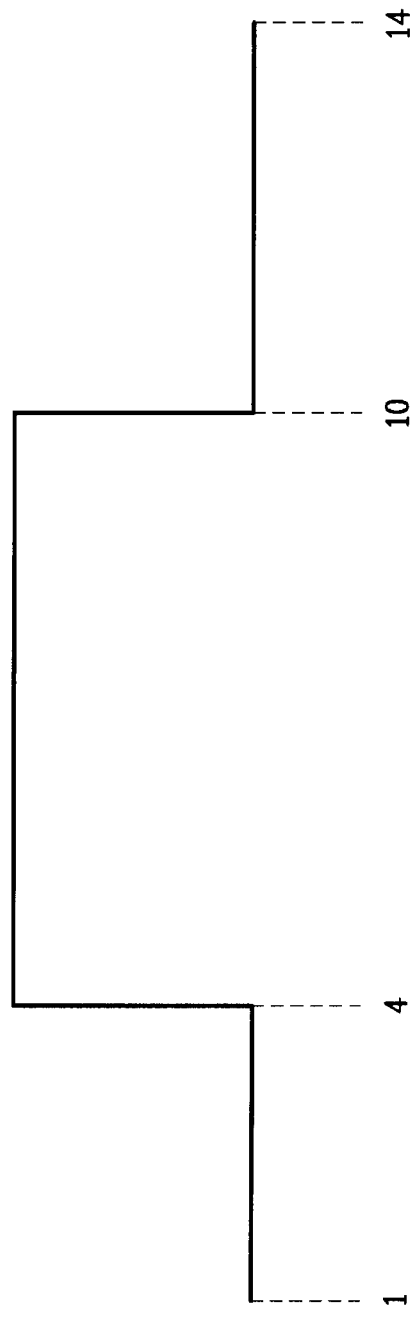

FIGS. 4(A) and (B) are diagrams of an analog waveform. As shown in FIG. 4(A), the vertical lines represent the samples taken by the microprocessor 30 from the A/D converter 26. Using the aforementioned method, only samples 1, 4, 10, and 14 and their associated time tags need to be stored to recreate the waveform. Because the waveform did not change in between these four readings, a straight line can be constructed to recreate the waveform as shown in FIG. 4(B). In this example, only 4 out of 14 samples need to be stored in RAM 34. This greatly increases the amount of data that can be stored while reducing the size of RAM 34 needed to store the data.

While the invention has been described with reference to certain preferred embodiments, numerous changes, alterations and modifications to the described embodiments are possible without departing from the spirit and scope of the invention as defined in the appended claims, and equivalents thereof.

What is claimed is:

1. A printed wiring board, comprising:
an input conditioner having a plurality of analog dc inputs and a plurality of analog dc outputs;
a switching circuit having an analog dc output, the switching circuit being connected to the
plurality of analog dc outputs of the input conditioner;
a sample and hold converter having an analog dc output, the sample and hold converter being connected to the analog dc output of the switching circuit;
an A/D converter having a digital output, the A/D converter being connected to the analog dc output of the sample and hold converter;

a microprocessor connected to the digital output of the A/D converter;

a timer circuit connected to the microprocessor;

a random access memory connected to the microprocessor; and a VME interface connected to the microprocessor, wherein the switching circuit comprises first, second and third dc multiplexers each having an analog dc output; a four channel programmable op amp, connected to the analog dc outputs of the first, second and third dc multiplexers, analog dc outputs of rms to dc converters being connected to the four channel programmable op amp; the four channel programmable op amp being connected to the sample and hold converter.

2. The printed wiring board of claim 1 further comprising an ac multiplexer having a plurality of analog ac inputs and a plurality of analog ac outputs; a plurality of rms to dc converters having a plurality of analog dc outputs, the rms to dc converters being connected to a plurality of analog ac outputs of the ac multiplexer, the analog dc outputs of the rms to dc converters being connected to the switching circuit; a zero crossing detector having three outputs, the zero crossing detector being connected to three analog ac outputs of the ac multiplexer; a phase detector connected to the three outputs of the zero crossing detector and to the microprocessor; a filter connected to one of the outputs of the zero crossing detector; and a frequency measurement circuit connected to the filter and to the microprocessor.

3. The printed wiring board of claim 2 wherein the zero crossing detector converts ac sine waves into TTL signals, the phase detector comprising an erasable programmable logic device for decoding the TTL signals into a three bit TTL word.

4. The printed wiring board of claim 3, wherein, for each channel of digital data output from the A/D converter, the microprocessor time tags and stores only readings that change in value, thereby increasing an amount of data that can be stored in the random access memory.

5. The printed wiring board of claim 2 wherein a switching speed of the four channel programmable op amp is about 900 nanoseconds.

6. The printed wiring board of claim 2 wherein the ac multiplexer accepts analog ac voltages up to about 7 volts rms and wherein a number of analog ac inputs is about 12.

7. The printed wiring board of claim 1 wherein the input conditioner accepts analog dc voltages up to about plus or minus 52 volts and outputs analog dc voltages up to about plus or minus 15 volts.

8. The printed wiring board of claim 1 wherein a number of analog dc inputs and a number of analog dc outputs is about 41.

* * * * *